US011578245B2

(12) United States Patent
Ota

(10) Patent No.: US 11,578,245 B2
(45) Date of Patent: Feb. 14, 2023

(54) THERMALLY-CONDUCTIVE SILICONE GEL COMPOSITION, THERMALLY-CONDUCTIVE MEMBER, AND HEAT DISSIPATION STRUCTURE

(71) Applicant: DOW TORAY CO., LTD., Tokyo (JP)

(72) Inventor: Kenji Ota, Ichihara (JP)

(73) Assignee: DOW TORAY CO., LTD., Tokyo (JP)

( * ) Notice: Subject to any disclaimer, the term of this patent is extended or adjusted under 35 U.S.C. 154(b) by 497 days.

(21) Appl. No.: 16/633,441

(22) PCT Filed: Jul. 11, 2018

(86) PCT No.: PCT/JP2018/026227
§ 371 (c)(1),
(2) Date: Apr. 5, 2020

(87) PCT Pub. No.: WO2019/021825
PCT Pub. Date: Jan. 31, 2019

(65) Prior Publication Data
US 2020/0270500 A1  Aug. 27, 2020

(30) Foreign Application Priority Data
Jul. 24, 2017  (JP) .............................. JP2017-142708

(51) Int. Cl.
| | | |
|---|---|---|
| C08L 83/04 | (2006.01) | |
| C09K 5/14 | (2006.01) | |
| H01M 10/613 | (2014.01) | |
| H01M 10/655 | (2014.01) | |
| C08J 3/075 | (2006.01) | |
| C08K 3/00 | (2018.01) | |
| H05K 1/02 | (2006.01) | |
| C08G 77/12 | (2006.01) | |
| C08G 77/20 | (2006.01) | |
| C08G 77/14 | (2006.01) | |

(52) U.S. Cl.
CPC ................. *C09K 5/14* (2013.01); *C08J 3/075* (2013.01); *C08K 3/00* (2013.01); *C08L 83/04* (2013.01); *H01M 10/613* (2015.04); *H01M 10/655* (2015.04); *C08G 77/12* (2013.01); *C08G 77/14* (2013.01); *C08G 77/20* (2013.01); *C08L 2201/08* (2013.01); *C08L 2203/20* (2013.01); *C08L 2205/025* (2013.01); *C08L 2205/03* (2013.01); *C08L 2312/08* (2013.01); *H05K 1/0203* (2013.01)

(58) Field of Classification Search
CPC .................................. C08L 83/04; C08K 9/06
See application file for complete search history.

(56) References Cited

U.S. PATENT DOCUMENTS

| | | | |
|---|---|---|---|
| 4,604,424 A | 8/1986 | Cole et al. | |
| 6,169,142 B1 | 1/2001 | Nakano et al. | |
| 6,380,301 B1 * | 4/2002 | Enami | C08K 5/5419 524/588 |
| 2002/0010245 A1 * | 1/2002 | Enami | C08K 9/06 523/210 |
| 2004/0254275 A1 * | 12/2004 | Fukui | C08L 83/04 524/261 |
| 2008/0139731 A1 | 6/2008 | Lawson et al. | |
| 2010/0140538 A1 | 6/2010 | Sekiba | |
| 2011/0188213 A1 | 8/2011 | Domae et al. | |
| 2011/0311767 A1 | 12/2011 | Elahee | |
| 2016/0237332 A1 | 8/2016 | Merrill et al. | |
| 2017/0121462 A1 | 5/2017 | Fujisawa et al. | |
| 2018/0022977 A1 | 1/2018 | Tsuji | |
| 2019/0292349 A1 | 9/2019 | Ito | |
| 2020/0239758 A1 | 7/2020 | Ota | |
| 2020/0270499 A1 | 8/2020 | Ota et al. | |

FOREIGN PATENT DOCUMENTS

| | | |
|---|---|---|
| JP | S62-184058 A | 8/1987 |
| JP | H11-209618 A | 8/1999 |
| JP | 2000-001616 A | 1/2000 |

(Continued)

OTHER PUBLICATIONS

International Search Report for PCT/JP2018/026227 dated Oct. 16, 2018, 2 pages.
Machine-assisted English translation of JP H11-209618 obtained from https://worldwide.espacenet.com on Feb. 4, 2020, 16 pages.
Machine-assisted English translation of JP 2005-162975 obtained from https://worldwide.espacenet.com on Feb. 4, 2020, 11 pages.
Machine-assisted English translation of JP 2013-124257 obtained from https://worldwide.espacenet.com on Feb. 4, 2020, 11 pages.
Machine-assisted English translation of JP 2015-119713 obtained from https://worldwide.espacenet.com on Feb. 4, 2020, 31 pages.

(Continued)

*Primary Examiner* — Margaret G Moore

(74) *Attorney, Agent, or Firm* — Warner Norcross + Judd LLP

(57) ABSTRACT

Provided is: a thermally conductive silicone gel composition which has a high thermal conductivity, and is less likely to flow out and slip off/drop off from a surface on which the gel composition is placed, even when the composition that has not been cured is placed on a sloped surface or in a vertical direction, and has excellent gap-filling ability with respect to a heat dissipation part, etc., and excellent repairability if desired; a thermally conductive member comprising the thermally conductive silicone gel composition; and a heat dissipation structure using the same. The thermally conductive silicone gel composition comprises: (A) an alkenyl group-containing organopolysiloxane; (B) an organohydrogenpolysiloxane; (C) a catalyst for a hydrosilylation reaction; (D) a thermally conductive filler; (E) a silane-coupling agent; and (F) a specific organopolysiloxane having a hydrolyzable silyl group at one end thereof. The gel composition has certain viscosity properties as disclosed herein.

15 Claims, No Drawings

(56) References Cited

FOREIGN PATENT DOCUMENTS

| | | | |
|---|---|---|---|
| JP | 2005-162975 | A | 6/2005 |
| JP | 2008-239719 | A | 10/2008 |
| JP | 2008-546861 | A | 12/2008 |
| JP | 2009-286855 | A | 12/2009 |
| JP | 2013-124257 | A | 6/2013 |
| JP | 2015-119173 | A | 6/2015 |
| JP | 2016-151010 | A | 8/2016 |
| JP | 2016-219738 | A | 12/2016 |
| JP | 2017-039802 | A | 2/2017 |
| JP | 2017-043717 | A | 3/2017 |
| JP | 2017-210518 | A | 11/2017 |
| WO | 2006107003 | A1 | 10/2006 |
| WO | 2012102852 | A1 | 8/2012 |
| WO | 2015/155950 | A1 | 10/2015 |
| WO | 2016/140020 | A1 | 9/2016 |

OTHER PUBLICATIONS

Machine-assisted English translation of JP 2016-151010 obtained from https://worldwide.espacenet.com on Feb. 4, 2020, 25 pages.
Machine-assisted English translation of JP 2016-219738 obtained from https://worldwide.espacenet.com on Feb. 4, 2020, 34 pages.
Machine-assisted English translation of JP 2017-039802 obtained from https://worldwide.espacenet.com on Feb. 4, 2020, 45 pages.
Machine-assisted English translation of JP 2017-043717 obtained from https://worldwide.espacenet.com on Feb. 4, 2020, 18 pages.

\* cited by examiner

THERMALLY-CONDUCTIVE SILICONE GEL COMPOSITION, THERMALLY-CONDUCTIVE MEMBER, AND HEAT DISSIPATION STRUCTURE

CROSS-REFERENCE TO RELATED APPLICATIONS

This application is the National Stage of International Appl. No. PCT/JP2018/026227 filed on 11 Jul. 2018, which claims priority to and all advantages of Japanese Appl. No. 2017-142708 filed on 24 Jul. 2017, the content of which is hereby incorporated by reference.

TECHNICAL FIELD

The present invention relates to a thermally conductive silicone gel composition that has high thermal conductivity, that is less likely to run or drip when applied to an inclined surface or in a vertical direction in an uncured state, and that has excellent gap-filling ability and repairability with respect to heat-dissipating components; and to a thermally conductive member composed of this composition, and a heat-dissipating structure using this member.

BACKGROUND ART

In recent years, the density and integration of printed circuit boards and hybrid ICs on which electronic components such as transistors, ICs and memory elements are mounted, and the capacity of secondary batteries (cells) have increased significantly. In order to more efficiently dissipate the heat generated by electronic and electrical devices such as these electronic components and batteries, thermally conductive silicone compositions comprising organopolysiloxanes, aluminum oxide powders, and thermally conductive fillers such as zinc oxide powder are increasingly being used. In particular, thermally conductive silicone compositions containing large amounts of thermally conductive fillers have been proposed to address the issue of higher heat dissipation.

For example, thermally conductive silicone compositions with higher thermal conductivity have been realized in Patent Document 1 and Patent Document 2. These documents propose that by treating the surface of a thermally conductive filler with a hydrolyzable silane having a long-chain alkyl group, the increase in the viscosity of these thermally conductive silicone compositions can be reduced despite a higher thermal conductive inorganic filler content to improve moldability, and flexibility and heat-resistant mechanical properties can be imparted to molded products. A thermally conductive silicone composition containing a thermal conductive filler surface-treated with two or more treatment agents with different molecular weights has been proposed in Patent Document 3. This document proposes that by adjusting the timing of addition of these treatment agents, the fluidity of the compound is not impaired despite high thermally conductive filler content.

However, the fluidity of these thermally conductive silicone compositions is still insufficient despite these reductions in viscosity and improvements in moldability. As a result, these compositions cannot be applied with precision to the structures of highly refined electric and electronic materials, and gaps occur with electronic components whose heat is to be dissipated, causing insufficient heat dissipation and latent heat buildup. When an electronic member requires repairability with respect to positioning and circuit rearrangement, thermally conductive silicone compositions of the prior art form thermally conductive cured products that readily adhere to the member, so it is difficult to peel off these thermally conductive cured products from the electronic member without leaving behind a residue. As a result, yield may decline during production, and the repair and reuse of electronic and electrical devices such as electronic components and batteries may be impaired.

In recent years, there has been an increasing demand for space saving measures and diversification of internal structures. As a result, there is growing need for heat-dissipating structures in the layout of electric and electronic devices such as heat-dissipating electronic components and batteries not only in the horizontal direction, but also on inclined surfaces and vertical surfaces (vertical wall surfaces). Onboard electrical and electronic devices in vehicles such as engine control units (ECUs) require structures vertically sandwiched between heat-dissipating members such as heat sinks as part of a layout in which a thin-film heat conductive member (such as grease) is placed on a heat-radiating component or on a circuit board with a mounted heat-radiating component. However, in these heat dissipation structures, the amount of heat dissipation from these heat dissipation components is increasing, and materials in the higher heat dissipating region of 3.5 W/mK or more are required.

The thermally conductive silicone compositions proposed in Patent Documents 1-3 have excellent thermal conductivity and have fluidity that has been improved to a certain extent. However, because of their low viscosity and fluidity, when they are arranged on an inclined surface or on a vertical surface, these compositions run or drip on these surfaces while in an uncured state or semi-cured state and often cannot be arranged at the desired site. However, when the viscosity of these thermally conductive silicone compositions is increased, gaps are more likely to occur between electronic members that radiate heat, and these compositions cannot sufficiently fill gaps between heat-dissipating components. Therefore, it can be very difficult to arrange these thermally conductive silicone compositions on an inclined surface or vertical surface (vertical wall surface) in an uncured state, provide excellent gap filling properties for heat-dissipating components, and prevent misalignment during use.

In Patent Document 4, the present applicant has proposed a thermally conductive silicone composition using reinforcing silica fine powder that has excellent vertical retention and hardly runs or drips even when arranged vertically in a severe temperature environment. However, this thermally conductive silicone composition has insufficient gap filling properties and repair properties with respect to heat-radiating components, the use of reinforcing silica fine powder tends to cause the amount of thermally conductive filler that can be used and the heat-radiating properties of the composition to plateau, and the realization of high thermal conductivity of 3.5 W/mK or more has not been disclosed (see the examples). Also, the subject of Patent Document 4 is a heat-radiating grease so a composition that is cured to provide a gel-like flexible thermally conductive member is neither mentioned nor suggested.

PRIOR ART DOCUMENTS

Patent Documents

Patent Document 1: JP H11-209618 A
Patent Document 2: JP 2000-001616 A
Patent Document 3: JP 2005-162975 A
Patent Document 4: JP 2009-286855 A

SUMMARY OF THE INVENTION

Problem to be Solved by the Invention

It is an object of the present invention to solve this problem by providing a thermally conductive silicone gel composition that has high thermal conductivity of 3.5 W/mK or more, that has excellent precision application properties and gap filling properties in electronic components with many gaps because of the high fluidity of the composition as a whole despite containing a large amount of thermally conductive inorganic filler, and that has excellent vertical retention such that the composition is less likely to run or drip when applied to an inclined surface or in a vertical direction in an uncured state. Because the resulting thermally conductive cured product is a flexible gel-like composition, the stress caused by differences in the coefficients of thermal expansion between an electronic component and a heat-radiating structure arranged on an inclined surface or in the vertical direction can be reduced and the possibility of component failure lowered. It is also an object of the present invention to provide a thermally conductive member composed using this thermally conductive silicone gel composition, and a heat-dissipating structure using this member.

Means for Solving the Problem

As a result of extensive research, the present inventors discovered that this problem could be solved by a thermally conductive silicone gel composition that imparts high thermal conductivity fluidity, and gap filling properties and that imparts thixotropic properties that make it possible to realize vertical retention properties in an uncured state. The present invention is a product of this discovery.

Specifically, the object of the present invention is achieved by a thermally conductive silicone gel composition comprising:

(A) an alkenyl group-containing organopolysiloxane having a viscosity at 25° C. of 10 to 100,000 mPa·s in an amount of 100 parts by mass;

(B) an organohydrogenpolysiloxane in an amount such that the silicon-bonded hydrogen atoms in component (B) are from 0.2 to 5 mol per mol of alkenyl groups in component (A);

(C) a hydrosilylation reaction catalyst in a catalytic amount;

(D) a thermally conductive filler in an amount from 1,200 to 7,500 parts by mass;

(E) one or more silane coupling agents or hydrolyzed condensates thereof; and (F) an organopolysiloxane represented by general formula (1) or general formula (2) below or a mixture of these;

wherein the total amount of component (E) and component (F) is 0.1 to 5.0% by mass and the mass ratio of component (E) to component (F) is in a range from 5:95 to 95:5 when the total mass of component (D) in the composition is 100% by mass;

(i) Organopolysiloxanes having a viscosity at 25° C. of from 10 to less than 10,000 mPa·s represented by general formula (1):

[Formula 1]

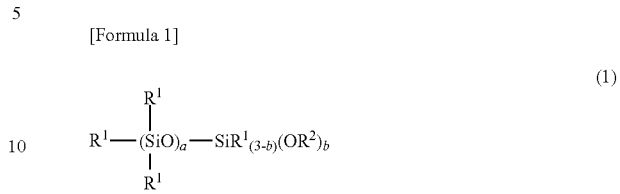

(1)

(In this formula, $R^1$ represents an unsubstituted or substituted monovalent hydrocarbon group, each $R^2$ independently represents a hydrogen atom, an alkyl group, an alkoxyalkyl group, or an acyl group, a is an integer from 5 to 250, and b is an integer from 1 to 3.)

(ii) Organopolysiloxanes represented by general formula (2):

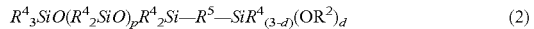
(2)

(In this formula, $R^4$ represents the same or different monovalent hydrocarbon group, $R^5$ is an oxygen atom or a divalent hydrocarbon group, $R^2$ is the same as above, p is an integer from 100 to 500, and d is an integer from 1 to 3.)

and wherein the thermal conductivity is at least 3.5 W/mK, the viscosity at a strain rate of 10 (1/s) is in a range from 50 to 400 Pa·s, and the viscosity at a strain rate of 1 (1/s) is 2.0 or more times the viscosity at a strain rate of 10 (1/s). Preferably, the amount of component (D) is in a range from 85 to 98% by mass relative to the composition as a whole, and the composition is substantially free of fillers other than component (D). Also, the thermal conductivity is preferably at least 4.0 W/mK, and the viscosity at a strain rate of 1 (1/s) is preferably 2.5 or more times the viscosity at a strain rate of 10 (1/s).

The object of the present invention is also achieved when component (E) contains (E1) an alkoxysilane having an alkyl group with 6 or more carbon atoms in the molecule and component (E2), and component (D) is surface-treated with component (E) and component (F). Preferably, the surface treatment with component (E) and component (F) is a surface treatment with heating, and component (E1) is an alkoxysilane having an alkyl group with 6 to 18 carbon atoms. The surface treatment of component (D) with component (E) and component (F) is preferably performed so that component (D) is surface-treated primarily with component (E) before component (D) is surface-treated primarily with component (F).

The object of the present invention is preferably achieved by a thermally conductive silicone gel composition, wherein component (B1) in component (B) has a viscosity at 25° C. of from 1 to 1,000 mPa·s and contains an average of 2 to 4 silicon-bonded hydrogen atoms per molecule, some being linear organohydrogenpolysiloxanes having at least 2 such atoms on a side chain of the molecular chain, and a relationship is established between the silicon-bonded hydrogen atoms $[H_{B1}]$ in component (B1) of the composition and the silicon-bonded hydrogen atoms in organohydrogenpolysiloxanes other than component (B1) $[H_{non-B1}]$ such that the value of $[H_{non-B1}]/([H_{B1}]/([H_{B1}]+[H_{non-B1}])$ is in a range of from 0.0 to 0.70. The same value may be 0.0 to 0.50, 0.0 to 0.25, or 0.0.

The object of the present invention is preferably achieved by a multicomponent-curable thermally conductive silicone gel composition further comprising (G) a heat resistance-imparting agent.

The object of the present invention is preferably achieved by a multicomponent-curable thermally conductive silicone gel composition, wherein component (D) is (D1) a tabular boron nitride powder having an average particle size of 0.1 to 30 μm, (D2) a granular boron nitride powder having an average particle size of 0.1 to 50 μm, (D3) a spherical and/or crushed aluminum oxide powder having an average particle size of 0.01 to 50 μm, (D4) graphite having an average particle size of 0.01 to 50 μm, or a mixture of two or more of these.

The object of the present invention is preferably achieved by a thermally conductive member comprising this thermally conductive silicone gel composition or a thermally conductive member obtained by curing this composition. It is also preferably achieved by a heat-dissipating structure comprising these thermally conductive members.

The object of the present invention is preferably achieved by a heat-dissipating structure obtained by providing a heat-dissipating member via the thermally conductive silicone gel composition or a cured product thereof on a heat-dissipating component or a circuit board including a mounted heat-dissipating component. At this time, the thermally conductive silicone gel composition or a cured product thereof is preferably arranged at a direction of 60° (inclination surface) to 90° (vertical surface) relative to the horizontal direction. A heat-dissipating structure in which the thermally conductive silicone gel composition or cured product thereof is sandwiched between heat-dissipating components or heat-dissipating members in an inclined direction or the vertical direction is especially preferred.

There are no particular restrictions on the heat-dissipating structure, though an electrical device, an electronic device, or a secondary battery is preferred. A fine heat-dissipating structure may be designed with the desired bond line thickness (BLT). Application in an electrical or electronic device (including a control unit in a vehicle) requiring arrangement in an inclined direction or the vertical direction relative to the horizontal direction is especially preferred.

Effects of the Invention

The present invention is able to provide a thermally conductive silicone gel composition that has high thermal conductivity of 3.5 W/mK or more, that has excellent precision application properties and gap filling properties in electronic components with many gaps because of the high fluidity of the composition as a whole despite containing a large amount of thermally conductive inorganic filler, and that has excellent vertical retention such that the composition is less likely to run or drip when applied to an inclined surface or in a vertical direction in an uncured state. Because the resulting thermally conductive cured product is a flexible gel-like composition, the stress caused by differences in the coefficients of thermal expansion between an electronic component and a heat-radiating structure arranged on an inclined surface or in the vertical direction can be reduced and the possibility of component failure lowered. In addition, the resulting thermally conductive cured product has good peelability and can be used to design a composition with excellent repairability for electronic components. The present invention can also provide a thermally conductive member using this thermally conductive silicone gel composition and a heat-dissipating structure using this member (especially a heat-dissipating structure for an electrical or electronic device such as a heat-dissipating structure for an electrical or electronic component or a heat-dissipating structure for a secondary battery). The present invention can also provide a heat-dissipating structure for an electrical or electronic device comprising a thermally conductive member of the present invention arranged on an incline or in the vertical direction relative to the horizontal direction.

EMBODIMENT OF THE INVENTION

[Thermally Conductive Silicone Gel Composition]

The composition of the present invention is a thermally conductive silicone gel composition comprising: (A) an alkenyl group-containing organopolysiloxane having a viscosity at 25° C. of 10 to 100,000 mPa·s; (B) an organohydrogenpolysiloxane; (C) a hydrosilylation reaction catalyst; (D) a thermally conductive filler; (E) one or more silane coupling agents or hydrolyzed condensates thereof; and (F) an organopolysiloxane represented by general formula (1) or general formula (2) below or a mixture of these in predetermined amounts.

(i) Organopolysiloxanes having a viscosity at 25° C. of from 10 to less than 10,000 mPa·s represented by general formula (1):

[Formula 2]

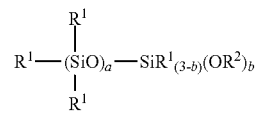
(1)

(In this formula, $R^1$ represents an unsubstituted or substituted monovalent hydrocarbon group, each $R^2$ independently represents a hydrogen atom, an alkyl group, an alkoxyalkyl group, or an acyl group, a is an integer from 5 to 250, and b is an integer from 1 to 3.)

(ii) Organopolysiloxanes represented by general formula (2):

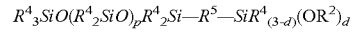
(2)

(In this formula, $R^4$ represents the same or different monovalent hydrocarbon group, $R^5$ is an oxygen atom or a divalent hydrocarbon group, $R^2$ is the same as above, p is an integer from 100 to 500, and d is an integer from 1 to 3.)

Optionally, a (G) heat resistance-imparting agent and other additives can be added. The following is a description of each of these components.

[(A) Alkenyl Group-Containing Organopolysiloxane]

The alkenyl group-containing organopolysiloxane in component (A) is a main component in the thermally conductive silicone gel composition and has a viscosity at 25° C. in a range from 10 to 100,000 mPa·s. The viscosity at 25° C. for component (A) is preferably in a range from 10 to 100,000 mPa·s and more preferably in a range from 10 to 10,000 mPa·s. When the viscosity of component (A) is less than 10 mPa·s, the resulting silicone gel tends to have poorer physical properties. When the viscosity of component (A) is greater than 100,000 mPa·s, the handling, workability, and gap filling properties of the resulting silicone gel composition tend to be poorer.

Component (A) is composed of one or more alkenyl group-containing organopolysiloxanes. There are no particular restrictions on the molecular structure of the alkenyl group-containing organopolysiloxanes, which can be linear, branched, cyclic, three-dimensionally reticulated, or a combination of these. Component (A) may consist solely of linear alkenyl group-containing organopolysiloxanes, solely of alkenyl group-containing organopolysiloxanes with a branched structure, or a mixture of linear alkenyl group-containing organopolysiloxanes and alkenyl group-containing organopolysiloxanes with a branched structure. Examples of an alkenyl group in the molecule include a vinyl group, an allyl group, a butenyl group, and a hexenyl group. Examples of an organic group other than an alkenyl group in component (A) include an alkyl group such as a methyl group, ethyl group or propyl group; an aryl group such as a phenyl group or tolyl group; or a monovalent hydrocarbon group excluding alkenyl groups such as a 3,3,3-trifluoropropyl group or other halogenated alkyl group.

Especially preferred as component (A) is a linear alkenyl group-containing organopolysiloxane, which preferably contains at least an alkenyl group at both ends of the molecular chain but may contain an alkenyl group at both ends of the molecular chain. There are no particular restrictions on component (A). However, examples include dimethylpolysiloxane capped at both ends of the molecular chain with a dimethylvinylsiloxy group, dimethylsiloxane/methylphenylsiloxane copolymers capped at both ends of the molecular chain with a dimethylvinylsiloxy group, dimethylsiloxane/methylvinylsiloxane copolymers capped at both ends of the molecular chain with a trimethylsiloxy group, dimethylsiloxane/methylvinylsiloxane/methylphenylsiloxane copolymer capped at both ends of the molecular chain with a trimethylsiloxy group, dimethylsiloxane/methylvinylsiloxane copolymers capped at both ends of the molecular chain with a silanol groups, polymers in which some of the methyl groups in the polymer are substituted with an alkyl group other than a methyl group such as an ethyl group or a propyl group, or a halogenated alkyl group such as a 3,3,3-trifluoropropyl group, polymers in which the vinyl group of the polymer is substituted with an alkenyl group other than a vinyl group such as an allyl group, a butenyl group, or a hexenyl group, and mixtures of two or more of these polymers. From the standpoint of preventing contact faults, low molecular weight siloxane oligomers (octamethyltetrasiloxane (D4) and decamethylpentasiloxane (D5)) are preferably reduced or eliminated from among these alkenyl group-containing organopolysiloxanes.

Component (A) in the present invention may have an alkoxysilyl-containing group bonded to a silicon atom represented by the following formula.

[Formula 3]

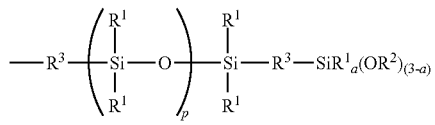

(In this formula, each $R^1$ is the same or different monovalent hydrocarbon group having no aliphatic unsaturated bond, $R^2$ is an alkyl group, each $R^3$ is the same or different alkylene group, a is an integer from 0 to 2, and p is an integer from 1 to 50.) Organopolysiloxanes with these functional groups hold down the viscosity of the composition in an uncured state, and function as a surface treatment agent for component (D) due to the alkoxysilyl group in the molecule. As a result, thickening and oil bleeding are suppressed in the resulting composition, and unhindered handling and workability may be obtained.

[(B) Organohydrogenpolysiloxane]

Component (B) is the primary crosslinking agent for a thermally conductive silicone gel composition of the present invention. Organohydrogenpolysiloxanes having two or more silicon-bonded hydrogen atoms in the molecule can be used without any restrictions. However, from the standpoint of the flexibility and vertical retention of the resulting thermally conductive silicone gel composition, the (average) number of silicon-bonded hydrogen atoms in the organohydrogenpolysiloxane molecule is preferably no more than eight.

[Amount of Organohydrogenpolysiloxane (Crosslinking Agent) in the Composition]

In component (B) for a composition of the present invention, the amount of silicon-bonded hydrogen atoms in component (B) has to be at least in a range from 0.2 to 5 mol or from 0.3 to 2.0 mol or from 0.4 to 1.0 mol per mol of alkenyl groups in component (A). It is especially preferred from the standpoint of the formation of a thermally conductive silicone gel cured product and the releasability and repairability of the cured product. More specifically, when the amount of silicon-bonded hydrogen atoms in component (B) is below the lower limit, the thermally conductive silicone gel composition may experience poor curing. When the amount exceeds the upper limit, the amount of silicon-bonded hydrogen atoms is excessive, and the releasability and repairability of the cured product may be impaired.

[Suitable Crosslinking Extender: Component (B1)]

From the standpoint of the releasability and repairability of the thermally conductive silicone gel cured product obtained by curing a composition of the present invention, component (B1) in component (B) has a viscosity at 25° C. from 1 to 1,000 mPa·s and contains an average of 2 to 4 silicon-bonded hydrogen atoms in the molecule. It preferably contains a linear organohydrogenpolysiloxane having at least two of these atoms on a side chain of the molecular chain. The structure of component (B1) means that component (B1) functions in the present composition as a cross-linking extender due to the hydrosilylation reaction of the silicon-bonded hydrogen atoms in the side chain of the molecular chain.

In a thermally conductive silicone gel composition of the present invention, component (B1) functions as a crosslinking extender for component (A), and gradually crosslinks the entire composition to form a gel-like cured product. Because component (B) has on average at least 2 silicon-bonded hydrogen atoms on a side chain of the molecular chain, and on average only 2 to 4 silicon-bonded hydrogen atoms in the molecule, the cross-linking extension reaction proceeds primarily due to the 2 to 4 silicon-bonded hydrogen atoms on the side chain, and a thermally conductive silicone gel cured product is formed with excellent releasability from members and excellent repairability for repair and reuse.

From the standpoint of improved releasability and repairability, component (B1-1) in component (B) is preferably a linear organohydrogenpolysiloxane having an average of 2 to 3 silicon-bonded hydrogen atoms in the molecule and, among these, at least 2 of these atoms on a side chain of the molecular chain. Component (B1-1-1) is especially preferably an organohydrogenpolysiloxane having an average of 2 to 3 silicon-bonded hydrogen atoms only on a side chain of the molecular chain. Most preferably, the silicon-bonded hydrogen atoms in component (B1) average 2 and only on a side chain of the molecular chain.

Examples of component (B1) include methyl hydrogen siloxane/dimethyl siloxane copolymers capped on both ends of the molecular chain with trimethylsiloxy groups and methyl hydrogen siloxane/dimethyl siloxane copolymers capped on both ends of the molecular chain with dimethyl hydrogen siloxy groups. The present invention is not limited to these examples and some of the methyl groups may be substituted with, for instance, a phenyl group, a hydroxyl group, or an alkoxy group.

There are no particular restrictions on the viscosity of component (B1) at 25° C., but a viscosity in a range from 1 to 500 mPa·s is preferred. From the standpoint of preventing contact faults, low molecular weight siloxane oligomers (octamethyltetrasiloxane (D4) and decamethylpentasiloxane (D5)) are preferably reduced or eliminated.

[Use of Other Crosslinking Agents]

Examples of organohydrogenpolysiloxanes other than component (B1) used in component (B) of the present invention as crosslinking agents include methyl hydrogen siloxane/dimethyl siloxane copolymers capped at both ends of the molecular chain with a trimethylsiloxy group and containing more than 4 silicon-bonded hydrogen atoms in the molecule on average, methyl hydrogen siloxane/dimethyl siloxane copolymers capped at both ends of the molecular chain with a dimethylsiloxy group and containing more than 4 silicon-bonded hydrogen atoms in the molecule on average, methyl hydrogen polysiloxane capped at both ends of the molecular chain with a trimethylsiloxy group, dimethyl polysiloxane capped at both ends of the molecular chain with a dimethyl hydrogen siloxy group, and methyl hydrogen siloxy group-containing siloxane resins. However, at least the aforementioned amount of component (B1) is preferably included as a crosslinking extender. From the standpoint of the curing properties of a composition of the present invention and the releasability and repairability of the cured product, the ratio of component (B1) is preferably at or above a certain amount even when other organohydrogenpolysiloxanes are included.

More specifically, where $[H_{B1}]$ is the silicon-bonded hydrogen atoms in component (B1) of the composition and $[H_{non-B1}]$ is the silicon-bonded hydrogen atoms in organohydrogenpolysiloxanes other than component (B1), the value of $[H_{non-B1}]/([H_{B1}]+[H_{non-B1}]$ is preferably in a range from 0.0 to 0.70. The same value may be 0.0 to 0.50, 0.0 to 0.25, or 0.0. When the value for $[H_{non-B1}]/([H_{B1}]+[H_{non-B1}]$ exceeds the upper limit, the effect of component (B) in the crosslinking agents of the composition is relatively small, the releasability and repairability of the cured product may be impaired, and poor curing may occur.

From the standpoint of the technical effects of the present invention, the following combinations of organohydrogenpolysiloxanes are preferred as crosslinking agents in the present composition.

(B'1): Component (B1) alone or component (B1) substantially alone with no other organohydrogenpolysiloxane intentionally included in the composition.

(B'2): An organohydrogen polysiloxane mixture containing component (B1) and one type or two or more types selected from among dimethyl polysiloxane capped at both ends of the molecular chain with a dimethyl hydrogen siloxy group, a methyl hydrogen siloxane/dimethyl siloxane copolymer capped at both ends of the molecular chain with a trimethylsiloxy group and containing on average 5 to 8 silicon-bonded hydrogen atoms in the molecule, and a methyl hydrogen siloxane/dimethyl siloxane copolymer capped at both ends of the molecular chain with a dimethylsiloxy group and containing on average 5 to 8 silicon-bonded hydrogen atoms in the molecule. Even when component (B'2) is used, the value for $[H_{non-B1}]/([H_{B1}]+[H_{non-B1}]$ is preferably within the range mentioned above.

When the organohydrogenpolysiloxane in the composition is a mixture represented by (B'2) above, especially a mixture of component (B1) and a dimethylpolysiloxane capped at both ends of the molecular chain with a dimethylhydrogensiloxy group, from the standpoint of improving the curability of the composition, the amount of silicon-bonded hydrogen atoms in the organohydrogenpolysiloxane is preferably in a range from 0.5 to 1.5 mol or from 0.7 to 1.0 mol. When the organohydrogenpolysiloxane in the composition is substantially component (B1) alone, the amount of silicon-bonded hydrogen atoms in the organohydrogenpolysiloxane is preferably in a range from 0.3 to 1.5 mol or from 0.4 to 1.0 mol. When the types and amount of organohydrogenpolysiloxanes in the composition are within the ranges mentioned above, the fluidity and gap filling properties of the thermally conductive silicone gel composition are excellent, and the physical properties of the resulting thermally conductive silicone gel cured product, especially releasability and repairability, are excellent. In other words, the technical effects of the present invention are excellent.

[(C) Hydrosilylation Reaction Catalyst]

The hydrosilylation reaction catalyst can be a platinum-based catalyst, a rhodium-based catalyst, and a palladium-based catalyst. A platinum-based catalyst is especially preferred because it promotes curing of the present composition to a remarkable degree. Examples of platinum-based catalysts include platinum fine powder, chloroplatinic acid, alcohol solutions of chloroplatinic acid, platinum-alkenylsiloxane complexes, platinum-olefin complexes, platinum-carbonyl complexes, and any of these platinum-based catalysts dispersed or encapsulated in a thermoplastic resin such as a silicone resin, polycarbonate resin, or acrylic resin. A platinum-alkenylsiloxane complex is especially preferred. Examples of alkenylsiloxane include 1,3-divinyl-1,1,3,3-tetramethyldisiloxane, 1,3,5,7-tetramethyl-1,3,5,7-tetravinylcyclotetrasiloxane, alkenyl siloxanes in which some of the methyl groups in the alkenyl siloxane have been substituted with, for example, ethyl groups or phenyl groups, and alkenyl siloxanes in which some of the vinyl groups in the alkenyl siloxane have been substituted with, for example, allyl groups or hexenyl groups. In particular, 1,3-divinyl-1,1,3,3-tetramethyldisiloxane is preferred because this platinum-alkenylsiloxane complex has good stability. Also, from the standpoint of improving the handling efficiency and pot life of the composition, a granular platinum-containing hydrosilylation reaction catalyst dispersed or encapsulated in a thermoplastic resin may be used. A non-platinum-based metal catalyst such as an iron, ruthenium, or iron/cobalt catalyst may be used to promote the hydrosilylation reaction.

The amount of hydrosilylation reaction catalyst added is a catalytic amount, preferably an amount with respect to component (A) such that the metal atoms are within a range from 0.01 to 500 ppm, from 0.01 to 100 ppm, or from 0.01 to 50 ppm by mass.

[Hydrosilylation Reaction Inhibitor]

From the standpoint of handling efficiency, a composition of the present invention preferably also contains a hydrosilylation reaction inhibitor. A hydrosilylation reaction inhibitor is a component for inhibiting a hydrosilylation reaction in a thermally conductive silicone gel composition of the present invention. Specific examples include acetylene-based (such as ethynylcyclohexanol), amine-based, carboxylate-based, and phosphite-based reaction inhibitors. The amount of reaction inhibitor added is usually from 0.001 to 5% by mass of the overall silicone gel composition. Although there are no particular restrictions, acetylene-based compounds such as 3-methyl-1-butyn-3-ol, 3,5-dimethyl-1-hexyn-3-ol and 3-phenyl-1-butyn-3-ol; enyne-based compounds such as 3-methyl-3-penten-1-yne and 3,5-dimethyl-3-hexen-1-yne; cycloalkenyl siloxanes such as 1,3,5,7-tetramethyl-1,3,5,7-tetravinylcyclotetrasiloxane and 1,3,5,7-tetramethyl-1,3,5,7-tetrahexenylcyclotetrasiloxane; and triazole compounds such as benzotriazole can be used to improve the handling and workability of the silicone gel composition.

[(D) Thermally Conductive Filler]

Component (D) is a thermally conductive filler used to impart thermal conductivity to the composition and to the thermally conductive member obtained by curing the composition. Component (D) is preferably at least one or more types of powder and/or fiber selected from a group consisting of pure metals, alloys, metal oxides, metal hydroxides, metal nitrides, metal carbides, metal silicides, carbons, soft magnetic alloys and ferrites. A metal powder, metal oxide powder, metal nitride powder, or carbon powder is preferred.

Some or all of the thermally conductive filler is preferably subjected to surface treatment with the alkoxysilane in component (E) described below. Separately from component (E) or together with component (E), these powders and/or fibers can be subjected to surface treatment agents known as coupling agents. In addition to Component (E), surface treatment agents used to treat the powders and/or fibers in component (D) include surfactants, other silane coupling agents, aluminum-based coupling agents, and silicone-based surface treatment agents.

Examples of pure metals include bismuth, lead, tin, antimony, indium, cadmium, zinc, silver, copper, nickel, aluminum, iron, and metallic silicon. Examples of alloys include those composed of two or more metals selected from a group consisting of bismuth, lead, tin, antimony, indium, cadmium, zinc, silver, aluminum, iron, and metallic silicon. Examples of the metal oxides include alumina, zinc oxide, silicon oxide, magnesium oxide, beryllium oxide, chromium oxide, and titanium oxide. Examples of metal hydroxides include magnesium hydroxide, aluminum hydroxide, barium hydroxide, and calcium hydroxide. Examples of metal nitrides include boron nitride, aluminum nitride, and silicon nitride. Examples of metal carbides include silicon carbide, boron carbide, and titanium carbide. Examples of metal silicides include magnesium silicide, titanium silicide, zirconium silicide, tantalum silicide, niobium silicide, chromium silicide, tungsten silicide, and molybdenum silicide. Examples of carbon include diamond, graphite, fullerene, carbon nanotube, graphene, activated carbon, and amorphous carbon black. Examples of soft magnetic alloys include Fe—Si alloys, Fe—Al alloys, Fe—Si—Al alloys, Fe—Si—Cr alloys, Fe—Ni alloys, Fe—Ni—Co alloys, Fe—Ni—Mo alloys, Fe—Co alloys, Fe—Si—Al—Cr alloys, Fe—Si—B alloys, and Fe—Si—Co—B alloys. Examples of ferrites include Mn—Zn ferrite, Mn—Mg—Zn ferrite, Mg—Cu—Zn ferrite, Ni—Zn ferrite, Ni—Cu—Zn ferrite, and Cu—Zn ferrite.

Component (D) is preferably silver powder, aluminum powder, aluminum oxide powder, zinc oxide powder, aluminum nitride powder, or graphite. When the composition requires electrical insulating properties, a metal oxide-based powder or a metal nitride-based powder is preferred, and aluminum oxide powder, zinc oxide powder, or aluminum nitride powder is especially preferred.

There are no particular restrictions on the shape of component (D), which may be spherical, acicular, disk shaped, rod shaped, or irregular. There are no particular restrictions on the average particle size of component (D), but is preferably in a range from 0.01 to 100 μm, and more preferably in a range from 0.01 to 50 μm.

Component (D) is preferably (D1) tabular boron nitride powder having an average particle size of 0.1 to 30 μm, (D2) granular boron nitride powder having an average particle size of 0.1 to 50 μm, (D3) spherical and/or crushed aluminum oxide powder having an average particle size of 0.01 to 50 μm, (D4) spherical and/or crushed graphite having an average particle size of 0.01 to 50 μm, or a mixture of two or more of these. Especially preferred is a mixture of two or more of spherical and/or crushed aluminum oxide powders having an average particle size of 0.01 to 50 μm. By combining an aluminum oxide powder with a large particle size and an aluminum oxide powder with a small particle size at a ratio following the close packing theoretical distribution curve, filling efficiency can be improved, the viscosity can be reduced, and the thermal conductivity can be increased.

The amount of component (D) per 100 parts by mass of component (A) is in a range from 1,200 to 7,500 parts by mass, preferably in a range from 1,500 to 6,000 parts by mass, and more preferably in a range from 2,000 to 5,500 parts by mass. When the amount of component (D) is below the lower limit of this range, the thermal conductivity of the resulting composition is less than 3.5 W/m. When the amount exceeds the upper limit of this range, the viscosity of the resulting composition is significantly higher despite the inclusion of component (E) or a surface-treated component (D), and handling, workability, and the gap filling properties of the composition are lower.

The composition of the present invention has a thermal conductivity of 3.5 W/mK or more, and the amount of component (D) is preferably in a range of from 85 to 98% by mass, and more preferably within a range of 87 to 95% by mass. In this range, a thermally conductive silicone gel composition can be designed which realizes thermal conductivity of 3.5 W/mK or higher, preferably 4.0 W/mK or higher, and more preferably 5.0 W/mK or higher while maintaining the excellent gap filling properties and fluidity that are an object of the present invention.

[Other Inorganic Fillers]

Optional components in a composition of the present invention may include inorganic fillers such as fumed silica, wet silica, crushed quartz, titanium oxide, magnesium carbonate, zinc oxide, iron oxide, diatomaceous earth, and carbon black ("inorganic filler" below). Although the use of inorganic fillers whose surface has been subjected to hydrophobic treatment with an organosilicon compound (such as a silazane) is not completely prohibited, the present invention is preferably substantially free of fillers other than component (D) from the standpoint of the technical effect of the present invention which combines high thermal conductivity and gap filling properties. When a reinforcing filler with a wide BET specific surface area such as reinforcing silica is included in the present composition, and component (D) is blended into the composition in an amount imparting thermal conductivity of at least 3.5 W/mK, it may be difficult to achieve the rheological characteristics of the present invention. Here, "substantially free" means 1% by mass or less, and preferably 0.5% by mass or less of a filler other than component (D) in the composition. Ideally, the amount of filler other than component (D) intentionally added to the composition is 0.0% by mass.

[Surface Treatment of Component (D)]

The composition contains a specific amount of component (E) and component (F) which are two surface treatment agents with different chemical structures. When the overall amount of component (D) in the present invention is 100% by mass, the amount of these components blended into the composition is from 0.1 to 5.0% by mass, and component (D) is preferably surface-treated with these components. Any method can be used to surface-treat component (D). However, from the standpoint of improving the fluidity, gap filling properties, and thixotropic properties of the composition, preferably at least some of component (D) is surface-treated with component (E) before component (D) is surface-treated with component (F).

[(E) One or More Silane Coupling Agents or Hydrolyzed Condensates Thereof]

Component (E) is a surface treating agent for component (D), and is a component used to improve the blending amount of component (D), and improve the viscosity and fluidity of the composition as a whole. Component (E) can by any silane coupling agent common in the art or hydrolyzed condensate thereof as there are no particular restrictions. However, use of component (E1) described below is preferred, which is an alkoxysilane having an alkyl group with 6 or more carbon atoms in the molecule.

The silane coupling agent in component (E) is represented by the following general formula.

$$R^1_{(4-c)}Si(OR^2)_c$$

In the formula, $R^1$ is a monovalent hydrocarbon group, an epoxy group-containing organic group, a methacrylic group-containing organic group, or an acryl group-containing organic group. Examples of monovalent hydrocarbon groups in $R^1$ include a straight-chain alkyl group such as a methyl group, an ethyl group, a propyl group, a butyl group, a hexyl group, and a decyl group; a branched alkyl group such as an isopropyl group, a tertiary butyl group and an isobutyl group; a cyclic alkyl group such as a cyclohexyl group; an alkenyl group such as a vinyl group, an allyl group, a butenyl group, a pentenyl group, a hexenyl group, and a heptenyl group; an aryl group such as a phenyl group, a tolyl group, and a xylyl group; an aralkyl group such as a benzyl group, and phenethyl group; and a substituted or unsubstituted monovalent hydrocarbon group including a halogenated alkyl group such as a 3,3,3-trifluoropropyl group and a 3-chloropropyl group. Examples of epoxy group-containing organic groups in $R^4$ include a glycidoxyalkyl group such as a 3-glycidoxypropyl group and a 4-glycidoxybutyl group; and an epoxycyclohexylalkyl group such as a 2-(3,4-epoxycyclohexyl) ethyl group and a 3-(3,4-epoxycyclohexyl) propyl group. Examples of a methacrylic group-containing organic groups in $R^1$ include a methacryloxyalkyl group such as a 3-methacryloxypropyl group and a 4-methacryloxybutyl group. Examples of acryl group-containing organic groups in $R^1$ include an acryloxyalkyl group such as a 3-acryloxypropyl group and a 4-acryloxysibutyl group.

Examples of $R^2$ include an alkyl group, an alkoxyalkyl group, an alkenyl group, or an acyl group. Examples of alkyl groups in $R^2$ include a linear alkyl group, a branched alkyl group, and a cyclic alkyl group. Examples of alkoxyalkyl groups in $R^2$ include a methoxyethyl group and a methoxypropyl group. Examples of alkenyl groups in $R^2$ include a vinyl group, an allyl group, a butenyl group, a pentenyl group, and a hexenyl group. Examples of acyl groups in $R^2$ include an acetyl group and an octanoyl group.

c is an integer from 1 to 3, preferably 3.

Examples of component (E) other than component (E1) include methyltrimethoxysilane, methyltriethoxysilane, ethyltrimethoxysilane, n-propyltrimethoxysilane, butyltrimethoxysilane, pentyltrimethoxysilane, vinyltrimethoxysilane, vinyltriethoxysilane, methylvinyldimethoxysilane, allyltrimethoxysilane, allylmethyldimethoxysilane, butenyltrimethoxysilane, 3-glycidoxypropyltrimethoxysilane, 3-glycidoxypropylmethyldimethoxysilane, 3-glycidoxypropyltriethoxysilane, 3-methacryloxypropyltrimethoxysilane, 3-methacryloxypropyltriethoxysilane, 3-methacryloxypropylmethyldimethoxysilane, 3-acryloxypropyltrimethoxysilane, and 3-acryloxypropylmethyldimethoxysilane.

[(E1) Alkylalkoxysilane]

Component (E1) is a preferable component in the present composition along with component (B1), and is an alkoxysilane having an alkyl group with 6 or more carbon atoms in the molecule. Specific examples of alkyl groups with 6 or more carbon atoms include an alkyl group such as a hexyl group, an octyl group, a dodecyl group, a tetradecyl group, a hexadecyl group, and an octadecyl group, and an aralkyl group such as a benzyl group and a phenylethyl group. An alkyl group with 6 to 20 carbon atoms is preferred. When an alkoxysilane having an alkyl group with less than 6 carbon atoms is used, the viscosity lowering effect on the composition is insufficient, the viscosity of the composition increases, and the desired fluidity and gap filling properties cannot be realized. When an alkoxysilane having an alkyl group with more than 20 carbon atoms is used, the industrial applicability is poor, and compatibility with various types of component (A) is low.

Preferably, component (E1) is an alkoxysilane represented by the following general formula.

$$Y_n Si(OR)_{4-n}$$

(In this formula, Y is an alkyl group having from 6 to 18 carbon atoms, R is an alkyl group having from 1 to 5 carbon atoms, and n is the integer 1 or 2.)

Examples of OR groups include a methoxy group, an ethoxy group, a propoxy group, and a butoxy group, but a methoxy group or ethoxy group is preferred. Also, n is 1, 2 or 3, but 1 is especially preferred.

Specific examples of component (E1) include $C_6H_{13}Si(OCH_3)_3$, $C_8H_{17}Si(OC_2H_5)_3$, $C_{10}H_{21}Si(OCH_3)_3$, $C_{11}H_{23}Si(OCH_3)_3$, $C_{12}H_{25}Si(OCH_3)_3$, and $C_{14}H_{29}Si(OC_2H_5)_3$, but decyltrimethoxysilane is especially preferred.

Component (E) of the present invention preferably contains component (E1). Component (E1) may be used alone or a mixture of component (E1) and another silane coupling agent may be used. If desired, a silane coupling agent other than component (E1) may be used alone, and some or all of the silane coupling agent may be hydrolyzed beforehand.

[(F) Polysiloxane Surface Treatment Agent Having a Hydrolyzable Silyl Group at One End of the Molecular Chain]

Component (F), unlike component (E), is a surface treatment agent having a hydrolyzable silyl group at one end of the molecular chain and having a polysiloxane structure. In treatment of component (D) with component (E), the surface treatment is preferably performed with component (E) before the surface treatment with component (F). In this way, a thermally conductive silicone gel composition can be provided with improved fluidity, gap filling properties, and thixotropic properties even when a large amount of the thermally conductive filler in component (D) has been included.

Component (F) is an organopolysiloxane represented by general formula (1) or general formula (2) below, or a mixture of these.

(i) Organopolysiloxanes having a viscosity at 25° C. of from 10 to less than 10,000 mPa·s represented by general formula (1):

[Formula 4]

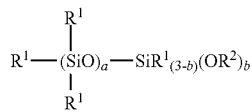  (1)

(In this formula, $R^1$ represents an unsubstituted or substituted monovalent hydrocarbon group, each $R^2$ independently represents a hydrogen atom, an alkyl group, an alkoxyalkyl group, or an acyl group, a is an integer from 5 to 100, and b is an integer from 1 to 3.)

(ii) Organopolysiloxanes represented by general formula (2):

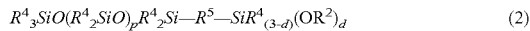  (2)

(In this formula, $R^4$ represents the same or different monovalent hydrocarbon group, $R^5$ is an oxygen atom or a divalent hydrocarbon group, $R^2$ is the same as above, p is an integer from 100 to 500, and d is an integer from 1 to 3.)

(i) Component (F) represented by general formula (1) has a hydrolyzable silyl group at one end of the molecular chain. By using component (F) as a surface treatment agent for component (D), a thermally conductive silicone gel composition with excellent vertical retention can be obtained in which the fluidity, gap filling properties, and thixotropic properties of the composition can be improved without adversely affecting handling and moldability despite the large amount of component (D) included. Good adhesiveness can also be imparted to a substrate in contact during the curing process.

In general formula (1), $R^1$ is independently an unsubstituted or substituted monovalent hydrocarbon group. Examples include linear alkyl groups, branched alkyl groups, cyclic alkyl groups, alkenyl groups, aryl groups, aralkyl groups, and halogenated alkyl groups. Examples of linear alkyl groups include a methyl group, an ethyl group, a propyl group, a hexyl group, and an octyl group. Examples of branched alkyl groups include an isopropyl group, an isobutyl group, a tert-butyl group, and a 2-ethylhexyl group. Examples of cyclic alkyl groups include a cyclopentyl group and a cyclohexyl group. Examples of alkenyl groups include a vinyl group and an allyl group. Examples of aryl groups include a phenyl group and a tolyl group. Examples of aralkyl groups include a 2-phenylethyl group and a 2-methyl-2-phenylethyl group. Examples of halogenated alkyl groups include a 3,3,3-trifluoropropyl group, a 2-(nonafluorobutyl) ethyl group, and a 2-(heptadecafluorooctyl) ethyl group. $R^1$ is preferably a methyl group or a phenyl group.

In general formula (1), each $R^2$ is independently a hydrogen atom, an alkyl group, an alkoxyalkyl group, an alkenyl group, or an acyl group. Examples of alkyl groups include the linear alkyl groups, branched alkyl groups, and cyclic alkyl groups listed in $R^1$ above.

Examples of alkoxyalkyl groups include a methoxyethyl group and a methoxypropyl group. Examples of acyl groups include an acetyl group and an octanoyl group. $R^2$ is preferably an alkyl group, and more preferably a methyl group or an ethyl group.

In general formula (1), a is an integer in a range from 5 to 250, and preferably in a range from 10 to 200. Also, b is an integer from 1 to 3, and is preferably 2 or 3.

(ii) Component (F) represented by general formula (2) has a hydrolyzable silyl group bonded via a divalent hydrocarbon group such as an alkylene group or an oxygen atom at one end of the molecular chain. By using component (F) as a surface treatment agent for component (D), a thermally conductive silicone gel composition with excellent vertical retention can be obtained in which the fluidity, gap filling properties, and thixotropic properties of the composition can be improved without adversely affecting handling and moldability despite the large amount of component (D) included.

Each $R^4$ in the formula is the same or different monovalent hydrocarbon group. Examples include the same linear alkyl groups, branched alkyl groups, cyclic alkyl groups, aryl groups, aralkyl groups, alkenyl groups, and halogenated alkyl groups described above, preferably a straight-chain alkyl group, and more preferably a methyl group. $R^5$ in the formula is an oxygen atom or a divalent hydrocarbon group. Examples of a divalent hydrocarbon group in $R^5$ include alkylene groups such as a methylene group, an ethylene group, a propylene group, an isopropylene group, and a butylene group; and an alkyleneoxyalkylene group such as an ethyleneoxyethylene group and an ethyleneoxypropylene group. $R^5$ is preferably an oxygen atom. $R^2$ in the above formula is the same as the groups described above. Also, p in the formula is an integer from 100 to 500, preferably an integer from 105 to 500, more preferably an integer from 110 to 500, and still more preferably an integer from 110 to 200. When p in the formula is below the lower limit of this range, there is a possibility that component (D) cannot be included in an amount large enough to obtain the thermally conductive silicone gel composition of the present invention. When the value exceeds the upper limit of the range, the volume of the molecules bound to the surface of component (D) may be too large, and there is a possibility that component (D) cannot be included in a large enough amount. In addition, d in the formula is an integer from 1 to 3, and is preferably 3.

The total amount of component (E) and component (F) used may be from 0.1 to 5.0% by mass, from 0.1 to 4.5% by mass, and from 0.2 to 2.0 or 4.0% by mass relative to component (D). When the amount of these components used is below the lower limit of this range, the viscosity reducing effect on the composition is insufficient. When the amount of component (E) and component (F) used exceeds the upper limit of this range, the viscosity reducing effect becomes saturated, the alkoxysilane may separate, and the storage stability of the composition may decline.

The mass ratio of component (E) to component (F) may be in a range from 5:95 to 95:5, in a range from 10:90 to 90:10, in a range from 15:85 to 70:30, and in a range from 15:85 to 40:60. Component (E) and component (F) need to be used together at least in this range. If only one of these components is used or if the components are used at a mass ratio outside of this range, fluidity, gap filling properties, and thixotropic properties of the composition cannot be sufficiently improved. In other words, the technical effect of the present invention is insufficient.

In the present invention, component (E) and component (F) are preferably blended together in a form in which component (D) has been surface-treated with these components. Here, the surface treatment of component (D) with component (E) and component (F) is performed simultaneously, or component (D) is surface treated with one of these components before component (D) is surface treated with the other component. Preferably, component (D) is surface treated primarily with component (E) before component (D) is surface treated with component (F) or at least some of component (D) is surface treated with component (E) before being surface treated with component (F) from the standpoint of improving the fluidity, gap filling properties and thixotropic properties of the composition.

There are no particular restrictions on the surface treatment method using component (E) and component (F). The thermally conductive inorganic filler in component (D) can, for example, be subjected to a direct treatment method, integral blending method, or dry concentrate method. Direct treatment methods include the dry method, slurry method, and spray method. Integral blending methods include the direct method and the master batch method. Drying methods include the slurry method and the direct method. Preferably, component (D) and component (E) are mixed together either all at once or in multiple stages beforehand using a conventional mixing device. Some of component (E) may be hydrolyzed or form a polymer on the surface of component (D) as described in Patent Document 1 and Patent Document 2. This is included under the concept of surface treatment in the present invention. Either form may be used but, from the standpoint of the technical effects of the present invention, some or all of component (D) is preferably treated with component (E) before component (F).

The surface treatment method with component (E) and component (F) in the present invention is preferably the direct treatment method and more preferably a surface treatment method with heat in which component (D) is mixed with component (E) and component (F) and heated (base heat). Specifically, after uniformly mixing component (D) or some of component (D) with component (E) and, optionally, with some of primary components (A) or (B), component (F) and the remaining component (D) can be stirred into the mixture under heat at 100 to 200° C. and preferably under reduced pressure. The temperature conditions and stirring time can be set based on the amount of sample used, but is preferably 120 to 180° C. and 0.25 to 10 hours. Component (D) can be treated by mixing at room temperature without the application of heating and stirring, and this treatment process can be selected. In this case, component (F) is preferably added after component (E) has been added.

In the present invention, as proposed, for example, in Patent Document 3, the thermally conductive filler in component (D) may be surface-treated with two or more kinds of treating agents having different molecular weights serving as component (E). At this time, component (D) may be surface treated by adding the treating agent with the high molecular weight followed by the treating agent with the low molecular weight. By selecting component (E1), good fluidity and gap filling properties can be realized in a one-step surface treatment instead of a multiple-step surface treatment. This is advantageous from a processing standpoint. Even here, component (F) is preferably added after component (E1).

There are no particular restrictions on the mixing device, which can be a single-shaft or twin-shaft continuous mixer, a two-roll mixer, a Ross mixer, a Hobart mixer, a dental mixer, a planetary mixer, a kneader mixer, or a Henschel mixer.

[Component (G)]

A composition of the present invention includes components (A) to (F) and optionally another crosslinking agent and a hydrosilylation reaction inhibitor. From the standpoint of improving the heat resistance of the heat-conductive silicone gel composition after mixing and the cured product thereof, the present invention preferably also contains (G) a heat resistance imparting agent. There are no particular restrictions on component (G) as long as it can impart heat resistances to a composition of the present invention and cured product thereof. Examples include metal oxides such as iron oxide, titanium oxide, cerium oxide, magnesium oxide, and zinc oxide, metal hydroxides such as cerium hydroxide, phthalocyanine compounds, cerium silanolate, cerium fatty acid salts, and reaction products of organopolysiloxanes with carboxylate salts of cerium. Especially preferred is a phthalocyanine compound. Examples include the additives selected from the group consisting of metal-free phthalocyanine compounds and metal-containing phthalocyanine compounds disclosed in JP 2014-503680 A. Among the metal-containing phthalocyanine compounds, copper phthalocyanine compounds are especially preferred. An example of a most suitable and non-limiting heat-resistance imparting agent is 29H,31H-phthalocyaninato (2-)—N29, N30, N31, N32 copper. These phthalocyanine compounds are available commercially, such as Stan-tone™ 40SP03 from PolyOne Corporation (Avon Lake, Ohio, USA).

The amount of component (G) may be in a range from 0.01 to 5.0% by mass, from 0.05 to 0.2% by mass, and from 0.07 to 0.1% by mass of the composition as a whole.

[Other Additives]

In addition to the components mentioned above, a thermally conductive silicone gel composition of the present invention may contain optional components as long as the object of the present invention is not impaired. Examples of optional components include organopolysiloxane not containing silicon-bonded hydrogen atoms and silicon-bonded alkenyl groups, cold resistance-imparting agents, flame retardants, pigments, and dyes. If desired, a thermally conductive silicone gel composition can also contain adhesion-imparting agents, one or more antistatic agents such as cationic surfactants, anionic surfactants, or nonionic surfactant; dielectric fillers; electrically conductive fillers; releasable components; thixotropy-imparting agents; and fungicide common in the art. If desired, an organic solvent may also be added.

[Manufacturing Method for the Composition]

A thermally conductive silicone gel composition of the present invention can be prepared by mixing together the components mentioned above. For example, a composition can be prepared by mixing together component (D) and component (E) beforehand, then mixing in component (F). After treating the surface of component (D) with component (E) and then component (F), the remaining components (A) to (C), component (G) and any optional components are mixed in. Alternatively, a composition can be prepared by mixing component (D) and component (E) in component (A), then mixing in component (F). After treating the surface with component (E) and then component (F), the remaining component (B), component (C), component (F) and any optional components are mixed in. A composition can also be prepared by mixing together component (D) and component (E) beforehand, then mixing in component (F). After mixing some of component (D) with component (E) at this time, the remaining component (F) and component (D) are mixed in.

Any mixing method common in the art can be used without restriction. However, use of a mixing device is preferred because a uniform mixture can be obtained by simple stirring. There are no particular restrictions on the mixing device, which can be a single-shaft or twin-shaft continuous mixer, a two-roll mixer, a Ross mixer, a Hobart mixer, a dental mixer, a planetary mixer, a kneader mixer, or a Henschel mixer.

[Form and Packaging of the Composition]

A thermally conductive silicone gel composition of the present invention can be used as a single-component curable composition (including a single-liquid composition) or may be used as a multiple-component curable composition (including a multiple-liquid composition or two-liquid composition) in which separately stored components are mixed together prior to use. In the case of a single-component curable composition, each of the constituent components of the composition can be stored in a single storage container before use. In the case of a multiple-component curable composition, separately stored compositions can be mixed together at a predetermined ratio and then used. The packaging can be selected as desired based on the curing method, application means, and target object described below, and is not subject to any particular restriction.

[Thermally Conductive Silicone Gel Composition]

A thermally conductive silicone gel composition of the present invention has thermal conductivity of at least 3.5 W/mK, excellent fluidity for precise dispensing, and excellent gap filling properties. Because a thermally conductive silicone gel composition of the present invention also has the thixotropic properties described below, it is less likely to run or drip even when applied in an uncured state to an inclined surface or vertical surface.

[Thixotropic Properties of the Composition]

This indicates the thixotropic behavior of a thermally conductive silicone gel composition of the present invention in an uncured state when measured using, for example, a rheometer. Specifically, the viscosity at a strain rate of 10 (1/s) is in a range from 50 to 400 Pa·s, and the viscosity at a strain rate of 1 (1/s) is 2.0 or more times the viscosity at a strain rate of 10 (1/s). This viscosity is measured for each strain rate (1/s) at 25° C. using, for example, a rheometer, and is indicated using Pa·s.

A thermally conductive silicone gel composition of the present invention in an uncured state has a viscosity at a strain rate of 10 (1/s) in a range of 50 to 400 Pa·s, preferably in a range of 75 to 250 Pa·s, and has a viscosity at a strain rate of 1 (1/s) that is 2.0 or more times, preferably 2.5 or more times, and more preferably in a range from 2.5 to 7.5 times, the viscosity at a strain rate of 10 (1/s). When the value is in this range, a thermally conductive silicone gel composition has an appropriate viscosity and suitable thixotropic behavior in an uncured state. As a result, it has excellent retention properties or vertical retention properties on an inclined surface without impairing the gap filling properties. If the viscosity of the composition exceeds the upper limit of this range, the viscosity is too high and this may result in poor gap filling properties. If the viscosity of the composition falls below the lower limit of this range, the viscosity is low and the composition may run or drip when applied to an inclined surface or vertical surface. When the viscosity at a strain rate of 1 (1/s) is less than 2.0 times the viscosity at a strain rate of 10 (1/s), the thixotropic properties of the composition are insufficient, and sufficient retention properties for inclined surfaces and vertical surfaces may not be realized even when the viscosity at a strain rate of 1 (1/s) is within the range mentioned above.

[Curability]

A thermally conductive silicone gel composition of the present invention is cured with a hydrosilylation reaction to form a cured silicone gel with excellent thermal conductivity. There are no particular restrictions on the temperature conditions for curing the hydrosilylation-curable silicone gel composition, but is usually in a range from 20° C. to 150° C. and is preferably in a range from 20 to 80° C. If desired, the composition may be cured at a high temperature for a short period time, or may be cured at a low temperature such as room temperature for a long period time (for example, several hours to several days). There are no particular restrictions.

The hardness of a silicone gel cured product of the present invention is preferably in a range from 2 to 70, and more preferably in a range from 2 to 50 when measured using a type E hardness meter in accordance with JIS K6249. A silicone gel cured product with a hardness in this range has the characteristics of a silicone gel, namely, a low elastic modulus and low stress. When the hardness is greater than 70, the adhesion to a heat-generating member is excellent but conformability may be poor. When the hardness is less than 2, conformability is excellent but adherence to a heat-generating member may be poor.

[Thermal Conductivity]

A thermally conductive silicone gel composition of the present invention can be filled stably with a thermally conductive filler, and has thermal conductivity of 3.5 W/mK or more, preferably 4.0 W/mK or more, and more preferably 5.0 W/mK. With a thermally conductive silicone gel composition of the present invention, a silicone gel composition and cured product with thermal conductivity 4.0 to 7.0 W/mK can be designed, and the gap filling properties mentioned above can be realized.

[Applications and Heat-Dissipating Structures]

In order to cool heat-generating components by thermal conduction, a thermally conductive silicone gel composition of the present invention is useful as a heat-transferring material (thermally conductive member) interposed at the interface between the heat interface of the heat-generating component and a heat-radiating member such as a heat sink or a circuit board, and a heat-dissipating structure containing this composition can be formed. There are no particular restrictions on the type, size, and fine structure of the heat-generating component. However, because a thermally conductive silicone gel composition of the present invention has excellent gap filling properties on members while maintaining high thermal conductivity, has good adherence and conformability to heat-generating members having fine uneven surfaces and narrow gap structures, and has the flexibility characteristic of gels, it is ideally suited for use in a heat-dissipating structure for an electrical or electronic component or an electrical or electronic device such as a cell-type secondary cell.

Because a thermally conductive silicone gel composition of the present invention has excellent vertical retention properties in an uncured state, the thermally conductive silicone gel composition or cured product thereof can be applied advantageously to a heat-dissipating structure arranged at an angle from 60° C. (inclined surface) to 90° (vertical surface) relative to the horizontal surface, and can be used advantageously in a heat-dissipating structure obtained by applying a thermally conductive silicone gel composition to an inclined surface or vertical surface in an uncured state and then cured as desired.

There are no particular restrictions on the configuration of the heat-dissipating structure. In one example, a heat-dissipating structure is obtained by providing a heat-dissipating member via a thermally conductive silicone gel composition or a cured product thereof on a heat-dissipating component or a circuit board including a mounted heat-dissipating component. In this structure, a heat-dissipating component such as an electronic component is mounted on a circuit board, and heat generated by the electronic component is dissipated by a heat dissipating member via a thin-film layer of a thermally conductive silicone gel composition or a cured product thereof. These members may be arranged horizontally, and a thin-film of thermally conductive silicone gel composition or cured product thereof may be held vertically between the circuit board and heat-dissipating means. Circuits and electronic components on a circuit board may be connected electrically and vias may be formed in the circuit board to more efficiently transfer the heat generated by the electronic components.

In this heat-dissipating structure, a thermally conductive silicone gel composition or cured product thereof is held vertically between the circuit board and the heat-dissipating member. There are no particular restrictions on the thickness, but it does not fall out at a thickness in a range from 0.1 to 2 mm, the composition can fill the space without leaving gaps, and heat generated by electronic components can be efficiently transmitted to the heat dissipating member.

There are no particular restrictions on electrical and electronic devices equipped with a member made of the thermally conductive silicone composition. Examples include secondary batteries such as a cell-type lithium ion electrode secondary batteries and cell stack-type fuel cells; electronic circuit boards such as printed circuit boards; IC chips packaged with optical semiconductor devices such as diodes (LEDs), organic electric field devices (organic ELs), laser diodes, and LED arrays; CPUs used in electronic devices such as personal computers, digital video discs, mobile phones, and smartphones; and LSI chips such as driver ICs and memory. In highly integrated, high-performance digital switching circuits, heat removal (radiation) is a major factor in the performance and reliability of integrated circuits. Even when a thermally conductive member using a thermally conductive silicone gel composition of the present invention is applied to power semiconductor applications such as engine control and power train system control in transportation machinery and air conditioner control, the heat-dissipating properties and handling efficiency are excellent. Even when used in a harsh environment incorporated into onboard electronic components such as electronic control units (ECU), the heat resistance and thermal conductivity are excellent.

By controlling the rheology of a thermally conductive silicone gel composition of the present invention, the composition can be suitably arranged not only on a horizontal plane but also on an inclined plane or a vertical plane, and can penetrate into the microstructure of a heat-generating component such as an electrical component, electronic component, or secondary battery to provide a heat-dissipating structure without gaps. In this way, it is less likely to come out when left vertically in a severe temperature environment, and can be used as a heat-dissipating member and a protective material for a control unit in an automobile. The dissipation of heat from electrical and electronic devices with a heat-dissipating structure is improved, problems associated with latent heat and overheating are reduced, some of the structure of electrical and electronic equipment is protected by the flexible gel-like cured product, and reliability and operation stability are improved.

Examples of materials constituting electrical and electronic devices include resins, ceramics, glass, and metals such as aluminum. A thermally conductive silicone gel composition of the present invention can be used on these materials whether in the form of a (fluid) thermally conductive silicone gel composition prior to curing, or as a thermally conductive silicone cured product.

[Curing Method]

There are no particular restrictions on the method used to form a heat-dissipating structure for a heat-generating component using a heat-conductive silicone gel composition of the present invention. For example, a thermally conductive silicone gel composition of the present invention can be poured onto the heat-dissipating portion of an electrical or electronic component to sufficiently fill gaps, and then heated or allowed to stand at room temperature to cure it.

In applications requiring rapid curing, a method in which heat is applied to cure the entire composition relatively quickly is preferred. As the heating temperature increases, bubbles and cracks are more likely to occur in the sealing agent used to seal and fill gaps in electrical and electronic components. Therefore, heating is preferably conducted in a range from 50 to 250° C. and more preferably in a range from 70 to 130° C. From the standpoint of handling and workability of a single-liquid package, use of a granular platinum-containing hydrosilylation reaction catalyst dispersed or encapsulated in a thermoplastic resin is preferred during heat curing.

A thermally conductive silicone gel composition of the present invention can also be cured at room temperature or by heating at 50 degrees or less. In this case, it is preferably cured after mixing for one hour to several days at room temperature or by heating at 50° C. or less.

The shape, thickness, and arrangement of the cured thermally conductive silicone gel can be selected as desired. The composition can be cured as necessary after the gaps in an electrical or electronic device have been filled, or applied on film provided with a release layer (separator), cured, and simply handled as a thermally conductive silicone gel cured product on film. In this case, the thermally conductive sheet may be reinforced using any reinforcing material common in the art.

[Specific Examples of Electrical and Electronic Devices]

Because a thermally conductive silicone gel composition of the present invention can be used to form a gel-like thermally conductive member with excellent gap filling properties, flexibility, and thermal conductivity, it is effective in electrical and electronic components with narrow gaps between electrodes, between electrical elements, between electronic elements, and between electrical elements and packages, and in structures that are difficult for silicone gels to conform to due to expansion and contraction. It can be used in semiconductor devices such as ICs, hybrid ICs and LSIs, electrical circuits and modules on which electrical elements such as semiconductor elements, capacitors and electric resistors have been mounted, sensors such as pressure sensors, igniters and regulators for automobiles, and power devices for power generating systems and space transportation systems.

EXAMPLES

The following is a more detailed description of the present invention with reference to examples. The present invention is not limited to these examples. In the examples, the compounds and compositions listed below were used as raw materials.

Components (A)-(G) were mixed together at the number of parts shown in Tables 1-2 using the methods indicated in each example and comparative example to obtain the multicomponent thermally conductive silicone gel compositions in Examples 1-3 and Comparative Examples 1-3.

[Preparation of the Thermally Conductive Silicone Gel Cured Products]

A 15 mm high×100 mm long×50 mm wide frame was prepared using a polyethylene backer on a polypropylene sheet, the frame was filled with a composition, a Teflon (registered trademark) sheet was pressed down on top to make the surface smooth, and curing was performed at 25° C. for one day. After curing, the Teflon (registered trademark) sheet and polyethylene backer were removed to obtain a thermally conductive silicone gel cured product. The thermally conductive silicone gel compositions obtained with the number of parts shown in Examples 1-3 and Comparative Examples 1-3 contained enough component (D) to obtain thermal conductivity of 4.5 W/mK. The thermal conductivity was measured with the probe method using QTM-500 from Kyoto Electronics.

Tests were performed to determine the effects of the present invention. The viscosity, hardness, and storage stability of the thermally conductive silicone compositions were measured as follows.

[Viscosity]

The viscosity (Pa·s) at 25° C. of the thermally conductive silicone compositions was measured using a rheometer (AR550) from TA Instruments. The geometry was measured using a parallel plate with a diameter of 20 mm after 120 seconds with gap of 200 μm and shear rates of 1.0 and 10.0 (1/s). The ratio of the viscosity at a shear rate of 1.0 to the viscosity at a shear rate of 10.0 was used as the thixotropic ratio.

[Hardness]

The hardness of the thermally conductive silicone cured product obtained under conditions described above was measured using an ASKER TYPE E hardness tester from ASKER.

[Vertical Retention]

The tip of a 2.5-ml thermosyringe was cut off and the syringe was filled with a thermally conductive silicone composition so as not to trap air. After smoothing the tip, the syringe was fixed at an angle of 90° and 5 cc of the contents were discharged. After one minute, the composition was checked for running and dripping.

The compositions of the present invention were formed using the following components.

Component (A):
A-1: Dimethylpolysiloxane capped at both ends of the molecular chain with a dimethylvinylsiloxy group (viscosity 60 mPa·s, Vi content 1.52% by mass)

Component (B):
B-1: A methyl hydrogen siloxane/dimethyl siloxane copolymer capped at both ends of the molecular chain with a trimethylsiloxy group, 2 on average in the molecule and 2 on a side chain of the molecular chain (viscosity 20 mPa·s, Si—H content 0.10% by mass)
Non-B-2: A methyl hydrogen siloxane/dimethyl siloxane copolymer capped at both ends of the molecular chain with a trimethylsiloxy group, 5 on average in the molecule and 5 on a side chain of the molecular chain (viscosity 5 mPa·s, Si—H content 0.75% by mass)

Component (C):
C-1: Complex of platinum and 1,3-divinyl-1,1,3,3-tetramethyldisiloxane with a platinum concentration of 0.6% by mass Component (D):
D-1: Crushed aluminum oxide powder with an average particle size of 0.4 μm
D-2: Crushed aluminum oxide powder with an average particle size of 2.5 μm
D-3: Spherical aluminum oxide powder with an average particle diameter of 35 μm Component (E):
E-1: Decyltrimethoxysilane Compound (F):
F-1: A polyorganosiloxane represented by the following formula

[Formula 5]

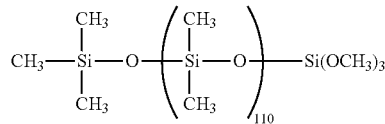

Component (G):
G-1: 29H,31H-phthalocyaninato (2-)—N29, N30, N31, N32 copper

Example 1

First, 100 parts by mass of component (A-1) and 15 parts by mass of component (E-1) were weighed out, and then 375 parts by mass of component (D-1), 375 parts by mass of component (D-2), and 1,600 parts by mass of component (D-3) were mixed into the mixture in successive order over 30 minutes. After 25 parts by mass of component (F-1) had been uniformly mixed in, heating and mixing were performed under reduced pressure at 160° C. for 60 minutes and the resulting mixture was cooled to room temperature. Next, 23.75 parts by mass of component (B-1), 0.5 part by mass of component (B-2), 1.0 part by mass of component (G-1), and 0.0063 parts by mass of phenylbutynol serving as a reaction inhibitor were uniformly mixed into the mixture. Then, 0.14 parts by mass of component (C-1) was uniformly mixed into the mixture to obtain a thermally conductive silicone composition. The viscosity and vertical retention properties of the thermally conductive silicone composition were measured using a rheometer (AR550) from TA Instruments. The composition was cured at 25° C. for 1 day, and the hardness was measured.

Comparative Example 1

First, 100 parts by mass of component (A-1), 15 parts by mass of component (E-1) and 25 parts by mass of component (F-1) were weighed out, and then 375 parts by mass of component (D-1), 375 parts by mass of component (D-2), and 1,600 parts by mass of component (D-3) were mixed into the mixture in successive order over 30 minutes. After heating and mixing for 60 minutes at 160° C. under reduced pressure, the resulting mixture was cooled to room temperature. Other components were mixed into the mixture in the same manner as Example 1 to obtain a thermally conductive silicone composition. The viscosity and vertical retention properties of the thermally conductive silicone composition were measured using a rheometer (AR550) from TA Instruments. The composition was cured at 25° C. for 1 day, and the hardness was measured.

TABLE 1

| Component | Ex. 1 | C. Ex. 1 |
|---|---|---|
| A-1 | 100 | 100 |
| B-1 | 23.75 | 23.75 |
| Non-B-2 | 0.5 | 0.5 |
| C-1 | 0.14 | 0.14 |
| D-1 | 375 | 375 |
| D-2 | 375 | 375 |
| D-3 | 1600 | 1600 |
| E-1 | 15 | 15 |
| F-1 | 25 | 25 |
| G-1 | 1.0 | 1.0 |
| Phenylbutynol | 0.0063 | 0.0063 |
| Si—H/Alkenyl Group Mol Ratio | 0.50 | 0.50 |
| $[H_{non-B1}]/[H_{B1}] + [H_{non-B1}]$ | 0.14 | 0.14 |
| Type E Hardness | 36 | 20 |
| Viscosity 1.0 (1/s) (Pa · s) | 578 | 187 |
| Viscosity 10.0 (1/s) (Pa · s) | 127 | 103 |
| Thixotropic Ratio | 4.6 | 1.8 |
| Vertical Retention | Retained | Dripping |

Example 2

First, 100 parts by mass of component (A-1) and 15 parts by mass of component (E-1) were weighed out, and then 375 parts by mass of component (D-1), 375 parts by mass of component (D-2), and 1,600 parts by mass of component (D-3) were mixed into the mixture in successive order over 30 minutes. Then, 32.5 parts by mass of component (F-1) was added, and the resulting mixture was mixed for 10 minutes until uniform. Other components were mixed into the mixture in the same manner as Example 1 to obtain a thermally conductive silicone composition. The viscosity and vertical retention properties of the thermally conductive silicone composition were measured using a rheometer (AR550) from TA Instruments. The composition was cured at 25° C. for 1 day, and the hardness was measured.

Comparative Example 2

First, 100 parts by mass of component (A-1), 15 parts by mass of component (E-1) and 32.5 parts by mass of component (F-1) were weighed out, and then 375 parts by mass of component (D-1), 375 parts by mass of component (D-2), and 1,600 parts by mass of component (D-3) were mixed into the mixture in successive order. After mixing for 10 minutes until uniform, a mixture was obtained. Other components were mixed into the mixture in the same manner as Example 1 to obtain a thermally conductive silicone composition. The viscosity and vertical retention properties of the thermally conductive silicone composition were measured using a rheometer (AR550) from TA Instruments. The composition was cured at 25° C. for 1 day, and the hardness was measured.

TABLE 2

| | Ex. 2 | C. Ex. 2 |
|---|---|---|
| A-1 | 100 | 100 |
| B-1 | 23.75 | 23.75 |
| Non-B-2 | 0.5 | 0.5 |
| C-1 | 0.14 | 0.14 |
| D-1 | 375 | 375 |
| D-2 | 375 | 375 |
| D-3 | 1600 | 1600 |
| E-1 | 15 | 15 |
| F-1 | 32.5 | 32.5 |
| G-1 | 1.0 | 1.0 |
| Phenylbutynol | 0.0063 | 0.0063 |
| Si—H/Alkenyl Group Mol Ratio | 0.49 | 0.49 |
| $[H_{non-B1}]/[H_{B1}] + [H_{non-B1}]$ | 0.14 | 0.14 |
| Type E Hardness | 14 | 11 |
| Viscosity 1.0 (1/s) (Pa · s) | 300 | 70 |
| Viscosity 10.0 (1/s) (Pa · s) | 94 | 56 |
| Thixotropic Ratio | 3.2 | 1.3 |
| Vertical Retention | Retained | Dripping |

Example 3

First, 100 parts by mass of component (A-1) and 15 parts by mass of component (E-1) were weighed out, and then 500 parts by mass of component (D-1) was mixed in. After 10 minutes, 25 parts by mass of component (F-1) was mixed in until uniform. Then, 500 parts by mass of component (D-2) and 1,350 parts by mass of component (D-3) were mixed in over 30 minutes in successive order. After heating and mixing for 60 minutes at 160° C. under reduced pressure, the resulting mixture was cooled to room temperature. Next, 25 parts by mass of component (B-1), 1.0 part by mass of component (G-1), and 0.0063 parts by mass of phenylbutynol serving as a reaction inhibitor were uniformly mixed into the mixture. Finally, 0.28 parts by mass of component (C-1) was uniformly mixed in to obtain a thermally conductive silicone composition. The viscosity and vertical retention properties of the thermally conductive silicone composition were measured using a rheometer (AR550) from TA Instruments. The composition was cured at 25° C. for 1 day, and the hardness was measured.

Comparative Example 3

First, 100 parts by mass of component (A-1), 15 parts by mass of component (E-1) and 25 parts by mass of component (F-1) were weighed out, and then 500 parts by mass of component (D-1), 500 parts by mass of component (D-2), and 1,350 parts by mass of component (D-3) were mixed into the mixture in successive order. After heating and mixing for 60 minutes at 160° C. under reduced pressure, the resulting mixture was cooled to room temperature. Other components were mixed into the mixture in the same manner as Example 3 to obtain a thermally conductive silicone composition. The viscosity and vertical retention properties of the thermally conductive silicone composition were measured using a rheometer (AR550) from TA Instruments. The composition was cured at 25° C. for 1 day, and the hardness was measured.

TABLE 3

| | Ex. 3 | C. Ex. 3 |
|---|---|---|
| A-1 | 100 | 100 |
| B-1 | 25 | 25 |
| C-1 | 0.28 | 0.28 |
| D-1 | 500 | 500 |
| D-2 | 500 | 500 |
| D-3 | 1350 | 1350 |
| E-1 | 15 | 15 |
| F-1 | 25 | 25 |
| G-1 | 1 | 1 |
| Phenylbutynol | 0.0063 | 0.0063 |
| Si—H/Alkenyl Group Mol Ratio | 0.48 | 0.48 |
| $[H_{non-B}]/[H_B] + [H_{non-B}]$ | 0.0 | 0.0 |
| Type E Hardness | 44 | 43 |

TABLE 3-continued

|  | Ex. 3 | C. Ex. 3 |
| --- | --- | --- |
| Viscosity 1.0 (1/s) (Pa · s) | 531 | 307 |
| Viscosity 10.0 (1/s) (Pa · s) | 193 | 177 |
| Thixotropic Ratio | 2.8 | 1.7 |
| Vertical Retention | Retained | Dripping |

As shown in Examples 1-3, each thermally conductive silicone gel composition of the present invention (designed thermal conductivity value: 4.5 W/mK) had high thermal conductivity, no running or dripping in an uncured state, and favorable hardness after curing in a range from 2 to 50.

Comparative Examples 1-3 in which component D was simultaneously treated with component E and component F of the present invention had high thermal conductivity and a favorable hardness in a range of 2 to 50, but did not satisfy the thixotropic properties defined by the invention in the present application. Therefore, running and dripping was observed in an uncured state and the compositions were not suitable for the uses intended for the present invention.

The invention claimed is:

1. A thermally conductive silicone gel composition comprising:
   (A) an alkenyl group-containing organopolysiloxane having a viscosity at 25° C. of 10 to 100,000 mPa·s in an amount of 100 parts by mass;
   (B) an organohydrogenpolysiloxane in an amount such that the silicon-bonded hydrogen atoms in component (B) are from 0.2 to 5 mol per mol of alkenyl groups in component (A);
   (C) a hydrosilylation reaction catalyst in a catalytic amount;
   (D) a thermally conductive filler in an amount of from 1,200 to 7,500 parts by mass;
   (E) one or more silane coupling agents or hydrolyzed condensates thereof; and
   (F) an organopolysiloxane represented by general formula (i) below, general formula (ii) below, or a mixture of these;
   wherein the total amount of component (E) and component (F) is 0.1 to 5.0% by mass based on 100 parts by mass of component (D) in the composition, and the mass ratio of component (E) to component (F) is in a range from 5:95 to 95:5;
   (i) organopolysiloxanes having a viscosity at 25° C. of from 10 to less than 10,000 mPa·s represented by general formula (1):

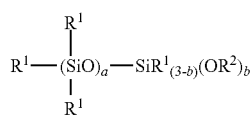  (1)

where $R^1$ represents an unsubstituted or substituted monovalent hydrocarbon group, each $R^2$ independently represents a hydrogen atom, an alkyl group, an alkoxyalkyl group, or an acyl group, a is an integer from 5 to 250, and b is an integer from 1 to 3;

(ii) organopolysiloxanes represented by general formula (2):

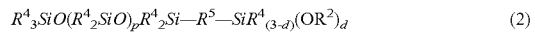  (2)

where $R^4$ represents the same or different monovalent hydrocarbon group, $R^5$ is an oxygen atom or a divalent hydrocarbon group, $R^2$ is the same as above, p is an integer from 100 to 500, and d is an integer from 1 to 3;
   wherein the thermal conductivity is at least 3.5 W/mK, the viscosity at a shear rate of 10 (1/s) is in a range from 50 to 400 Pa·s, and the viscosity at a shear rate of 1 (1/s) is 2.0 or more times the viscosity at a shear rate of 10 (1/s); and
   wherein at least some of component (D) is surface-treated with component (E) before component (D) is surface-treated with component (F).

2. The thermally conductive silicone gel composition according to claim 1, wherein the amount of component (D) is in a range from 85 to 98% by mass relative to the composition as a whole, and the composition is substantially free of fillers other than component (D).

3. The thermally conductive silicone gel composition according to claim 1, wherein the thermal conductivity is at least 4.0 W/mK, and the viscosity at a shear rate of 1 (1/s) is 2.5 or more times the viscosity at a shear rate of 10 (1/s).

4. The thermally conductive silicone gel composition according to claim 1, wherein component (E) comprises (E1) an alkoxysilane having an alkyl group with 6 or more carbon atoms in the molecule, and component (D) is surface-treated with component (E) and component (F).

5. The thermally conductive silicone gel composition according to claim 4, wherein surface treatment of component (D) with component (E) and component (F) is a surface treatment with heating.

6. The thermally conductive silicone gel composition according to claim 4, wherein component (E1) is an alkoxysilane having an alkyl group with 6 to 18 carbon atoms.

7. The thermally conductive silicone gel composition according to claim 1, wherein component (B) comprises component (B1) and component (B1) has a viscosity at 25° C. of from 1 to 1,000 mPa·s and contains an average of 2 to 4 silicon-bonded hydrogen atoms per molecule, component (B1) comprising linear organohydrogenpolysiloxanes having at least 2 such atoms on a side chain of the molecular chain, and a relationship is established between the silicon-bonded hydrogen atoms $[H_{B1}]$ in component (B1) of the composition and the silicon-bonded hydrogen atoms in organohydrogenpolysiloxanes other than component (B1) $[H_{non-B1}]$ such that the value of $[H_{non-B1}]/([H_{B1}]/([H_{B1}]+[H_{non-B1}])$ is in a range of from 0.0 to 0.70.

8. The thermally conductive silicone gel composition according to claim 1, further comprising (G) a heat resistance-imparting agent.

9. The thermally conductive silicone gel composition according to claim 1, wherein component (D) is (D1) a tabular boron nitride powder having an average particle size of 0.1 to 30 μm, (D2) a granular boron nitride powder having an average particle size of 0.1 to 50 μm, (D3) a spherical and/or crushed aluminum oxide powder having an average particle size of 0.01 to 50 μm, (D4) graphite having an average particle size of 0.01 to 50 μm, or a mixture of two or more of these.

10. A thermally conductive member comprising the thermally conductive silicone gel composition according to claim 1 or a cured product thereof.

11. A heat-dissipating structure comprising the thermally conductive member according to claim 10.

12. A heat-dissipating structure obtained by providing a heat-dissipating member via the thermally conductive silicone gel composition according to claim 1 or a cured product thereof on a heat-dissipating component or a circuit board including a mounted heat-dissipating component.

13. A heat-dissipating structure wherein the thermally conductive silicone gel composition according to claim 1 or a cured product thereof is arranged at 60° to 90° relative to the horizontal direction.

14. The heat-dissipating structure according to claim 11, wherein the heat-dissipating structure is an electrical device or electronic device.

15. The heat-dissipating structure according to claim 11, wherein the heat-dissipating structure is an electrical device, an electronic device, or a secondary battery.

* * * * *